United States Patent [19]
Terashima

[11] Patent Number: 6,157,085
[45] Date of Patent: Dec. 5, 2000

[54] SEMICONDUCTOR DEVICE FOR PREVENTING EXFOLIATION FROM OCCURRING BETWEEN A SEMICONDUCTOR CHIP AND A RESIN SUBSTRATE

[75] Inventor: Kazuhiko Terashima, Tokyo, Japan

[73] Assignee: Citizen Watch Co., Ltd., Tokyo, Japan

[21] Appl. No.: 09/055,883

[22] Filed: Apr. 7, 1998

[51] Int. Cl.$^7$ ..................................... H01L 23/29
[52] U.S. Cl. .................... 257/783; 257/782; 257/691; 257/786
[58] Field of Search ..................... 257/782, 783, 257/786, 778, 787, 668, 691, 666, 780, 781

[56] References Cited

U.S. PATENT DOCUMENTS

| | | | |
|---|---|---|---|
| 5,001,542 | 3/1991 | Tsukagoshi et al. | 257/783 |
| 5,113,241 | 5/1992 | Yanagida et al. | 257/783 |
| 5,136,365 | 8/1992 | Pennisi et al. | 257/783 |
| 5,311,059 | 5/1994 | Banerji et al. | 257/778 |
| 5,350,947 | 9/1994 | Takekawa et al. | 257/778 |
| 5,371,404 | 12/1994 | Juskey et al. | 257/787 |
| 5,739,588 | 4/1998 | Ishida et al. | 257/782 |
| 5,796,589 | 8/1998 | Barrow | 257/778 |

*Primary Examiner*—Sheila V. Clark
*Attorney, Agent, or Firm*—Armstrong, Westerman, Hattori, McLeland & Naughton

[57] ABSTRACT

A PBGA-type semiconductor device is comprised such that a semiconductor chip is fixedly attached to the front surface of a resin substrate thereof with the use of an adhesive composed mainly of a resin material. As both the resin substrate and the adhesive are composed mainly of resin materials, adhesion therebetween is excellent, and risk of exfoliation of the semiconductor chip from the resin substrate is eliminated owing to strong bonding therebetween. Furthermore, power-source related connection electrodes are formed so as to be extended to a region where the semiconductor chip is fixedly attached onto the front surface of the resin substrate while an electrically conductive adhesive is used as the adhesive. As a result, the body of the semiconductor chip and the power-source related connection electrodes are rendered to be equal in potential while heat generated in the semiconductor chip can be radiated via the electrically conductive adhesive and the power-source related connection electrodes.

12 Claims, 12 Drawing Sheets

SEMICONDUCTOR DEVICE FOR PREVENTING EXFOLIATION FROM OCCURRING BETWEEN A SEMICONDUCTOR CHIP AND A RESIN SUBSTRATE

BACKGROUND OF THE INVENTION

1. Field of the Invention

The invention relates to a semiconductor device, and more particularly, to a plastic ball grid array (referred to hereinafter as PBGA)-type semiconductor device constructed such that a semiconductor chip is surface mounted on a resin substrate thereof, the resin substrate is provided with solder ball terminals for connection with a mother board, and further the semiconductor chip is sealed with a resin.

2. Description of the Related Art

PBGA-type semiconductor devices have been in widespread use for electronic equipment of miniature size including portable communication equipment such as portable telephones, pager units, and the like because the devices can be mounted in a high density contributing to miniaturization of the equipment, and in addition, have excellent electrical characteristics.

FIG. 11 is a sectional view showing the construction of a conventional PBGA-type semiconductor device, and FIG. 12 is a plan view showing the front surface of a resin substrate, a component of the semiconductor device.

The conventional PBGA-type semiconductor device shown in these figures is described hereinafter in accordance with the sequence of a fabrication process thereof.

A resin substrate 1 is used as the substrate for mounting a semiconductor chip thereon. The resin substrate 1 is formed into a substantially square shape as seen in the plan view, and is composed of a resin material on the order of 0.2 mm in thickness. As the material for forming the resin substrate 1, a resin material such as epoxy resin, polyimide resin, and the like is cited. However, epoxy resin impregnated with glass fiber is preferably to be used.

The front and back surfaces of the resin substrate 1 are provided with a copper foil layer with about 18 $\mu$m in thickness, and further, with a plurality of through holes 2 formed by drilling means such as a cutting drill, or the like.

Then, all the surfaces of the resin substrate 1 including the sidewall faces of the through holes 2 are rinsed, and coated with a copper-plated layer formed by an electroless plating process and an electroplating process. The copper-plated layer is formed inside the through holes 2 as well.

Subsequently, an etching treatment is applied to the resin substrate 1 using an etching mask pattern and an etchant.

As shown in FIG. 12, as a result of the etching treatment, a die pattern 3, connection electrodes 4, power-source related connection electrodes 4a, conduction paths 5 for electrically connecting the connection electrodes 4 with the through holes 2, conduction paths 6 for electrically connecting the power-source related connection electrodes 4a with the through holes 2, and conduction paths 7 for electrically connecting the power-source related connection electrodes 4a with the die pattern 3 are formed of the copper-plated layer, and disposed on the front surface of the resin substrate 1.

The die pattern 3 is provided to keep the body of a semiconductor chip 8 at the same potential as that of the power-source related connection electrodes 4a so that the semiconductor chip 8 will not be subjected to noise effects as described hereinafter, and also to form a path for the radiation of heat generated in the semiconductor chip 8.

The connection electrodes 4 are provided for electrical connection with respective electrodes of the semiconductor chip 8, and the power-source related connection electrodes 4a for electrical connection with power-source electrodes of the semiconductor chip 8.

Meanwhile, by the etching treatment as described above, pad electrodes 11 for soldering solder ball terminals 10 thereto, composed of the copper-plated layer, are formed on the back surface of the resin substrate 1 as shown in FIG. 11. Conduction paths 13 for electrically connecting the respective pad electrodes with each of the through holes 2, composed of the copper-plated layer, are also formed on the back surface of the resin substrate 1 by the etching treatment.

The connection electrodes 4 and the pad electrodes 11, as described above, are electrically connected with one another via the copper-plated layer formed inside the through holes 2. The power source related connection electrodes 4a and the pad electrodes 11 are also electrically connected with one another via the copper-plated layer formed inside the through holes 2.

Thereafter, insulating resin films 15, composed of a material such as epoxy resin, or the like, are formed on the front and back surfaces of the resin substrate 1 which have been treated by the etching treatment. The insulating resin films 15 are provided for protection of the respective conduction paths 5, 6, 7, and 13 as described above. In FIG. 12, a region where the insulating resin film 15 is formed is indicated by hatching.

In this instance, the insulating resin film 15 is not formed in the center area on the front surface of the resin substrate 1, exposing the die pattern 3, the connection electrodes 4, and the power-source related connection electrodes 4a. The hatched region shown in FIG. 12 is the region where the insulating resin film 15 is formed. The insulating resin film 15 is not formed in regions for the pad electrodes 11 formed on the back surface of the resin substrate 1, exposing the pad electrodes 11.

Thereafter, a nickel (Ni)-plated layer (not shown) with about 2 to 5 $\mu$m in thickness is formed on the surfaces of the die pattern 3, connection electrodes 4, power-source related connection electrodes 4a, and pad electrodes 11, which are all exposed from the insulating resin film 15, and further, a gold (Au)-plated layer (not shown) having excellent conductivity is formed in a thickness on the order of 0.5 $\mu$m on the front surface of the nickel (Ni)-plated layer.

The semiconductor chip 8 is fixedly attached onto the gold (Au)-plated layer formed over the die pattern 3 with the use of an electrically conductive adhesive 16 composed of a resin compound such as epoxy resin, phenol resin, or the like as the main component thereof.

Subsequently, signal related electrodes and the power-source related electrodes (either of the ones on the ground side or the power-source side) of the semiconductor chip 8 are connected with the connection electrodes 4 via connecting wires 17. Further, the power-source related electrodes of the semiconductor chip 8, on the side not connected with the connection electrodes 4, are connected with the power-source related connection electrodes 4a via connecting wires 17. As a material for the connecting wires 17, a gold (Au) wire excellent in conductivity is used.

Then, the semiconductor chip 8 and the connecting wires 17 are sealed by a transfer molding process using a thermosetting sealing resin 18 to shield from light and protect the semiconductor chip 8.

The solder ball terminals 10 are fused to the each pad electrode 11 formed on the back surface of the resin substrate 1. The solder ball terminals 10 are used for electrical connection with wiring patterns on the mother board substrate (not shown).

With the conventional semiconductor device as described above, the die pattern 3 is formed in the center area on the front surface of the resin substrate 1, and the semiconductor chip 8 is fixedly attached onto the die pattern 3 with the use of the electrically conductive adhesive 16. Since the die pattern 3 is electrically continuous with the power-source related connection electrodes 4a, the body of the semiconductor chip 8 will be at the same potential as that of the power-source related connection electrodes 4a via the electrically conductive adhesive 16 and the die pattern 3. As a result, the semiconductor chip 8 can be shielded so as to be protected from ambient noise.

Further, the die pattern 3 is electrically continuous with the solder ball terminals 10 via the power-source related connection electrodes 4a, the conduction paths 6, the copper-plated layer inside the through holes 2, and the pad electrodes 11. As the solder ball terminals 10 will be electrically connected with wiring patterns formed on the mother board of various pieces of electronic equipment, heat generated in the semiconductor chip 8 is radiated to the mother boards via a path from the die pattern 3 to the solder ball terminals 10.

Although the die pattern 3 has functions as described above, it has been also a factor for causing the following problem.

That is, the solder ball terminals 10 are connected with wiring patterns formed on the mother board of various pieces of electronic equipment by the reflow soldering process. In this case, the semiconductor device as a whole is heated up to a temperature higher than the melting point of the solder balls, and when the temperature of the semiconductor device as a whole reaches not lower than 200° C., a shearing force is caused to occur between the underside surface of the semiconductor chip 8 and the resin substrate 1 due to a difference in thermal expansion coefficient therebetween, occasionally causing exfoliation at the interface therebetween where adhesion force is weak.

There have been many occurrences of exfoliation, particularly, at the interface between the front surface of the die pattern 3, composed of a metallic material, and the electrically conductive adhesive 16 composed of a resin compound such as epoxy resin, phenol resin, or the like as the main component thereof, due to weak adhesion force therebetween.

Furthermore, in the case where a gold (Au)-plated layer, which is an inert metallic material, is formed on the front surface of the die pattern 3, adhesion force between the front surface of the die pattern 3 and the electrically conductive adhesive 16, composed of a resin compound such as epoxy resin, phenol resin, or the like as the main component thereof, has been further weakened, frequently causing exfoliation.

Also, in the case where minute air bubbles are present at an interface between the die pattern 3 and the electrically conductive adhesive 16, there has been a fear of the air bubbles expanding upon heating during the reflow soldering process, resulting also in the occurrence of exfoliation.

As the resin substrate 1 is absorbent of and permeable to moisture, the moisture in the resin substrate 1 flows into a gap defined between the die pattern 3 and the electrically conductive adhesive 16 as a result of exfoliation, further spreading the area of exfoliation.

As there is a fear of such exfoliation occurring between the die pattern 3 and the electrically conductive adhesive 16 causing deformation of the resin substrate 1, resulting in a break in wirings between the electrodes on the resin substrate 1 and the electrodes on the side of the semiconductor chip 8, reliability of the semiconductor device has been impaired.

SUMMARY OF THE INVENTION

It is therefore an object of the invention to solve the problems described above by preventing exfoliation from occurring between a semiconductor chip and a resin substrate.

In order to achieve the object, the PBGA-type semiconductor device according to the invention is constructed such that the semiconductor chip is fixedly attached onto the front surface of the resin substrate with an adhesive mainly composed of a resin material, interposed therebetween. Since both the resin substrate and the adhesive are composed of resin materials as the main component thereof, adhesion therebetween is excellent, eliminating the risk of exfoliation owing to strong bonding therebetween.

Further, since the body of the semiconductor chip can be kept at the same potential as that of power-source related connection electrodes of the resin substrate, and be shielded even without a die pattern installed when an electrically conductive adhesive composed of a resin material as the main component thereof is used as the adhesive, while the power-source related connection electrodes are formed so as to be extended up to a region where the semiconductor chip is fixedly attached onto the front surface of the resin substrate, noise effects on the semiconductor chip can be reduced, and heat generated in the semiconductor chip can be radiated via the power-source related connection electrodes and the electrically conductive adhesive.

In the case where an insulating resin film is formed in the region where the semiconductor chip is fixedly attached onto the front surface of the resin substrate, adhesion between the insulating resin film and the adhesive is further enhanced, precluding occurrence of air bubbles therebetween with the result that exfoliation due to the presence of the air bubbles can be prevented. In the case where the power-source related electrodes are formed in the region on the front surface of the resin substrate, where the semiconductor chip is fixedly attached, the insulating resin film is formed in regions excluding areas where the power-source related electrodes are formed.

Further, in the case that the power-source related connection electrodes are formed in a ring-like pattern so as to surround the periphery of the region where the semiconductor chip is fixedly attached onto the front surface of the resin substrate, there will be no need for altering the electrode patterns on the front surface of the resin substrate even when surface mounting the semiconductor chip provided with power-source electrodes arranged in a different configuration, and the power-source electrodes of the semiconductor chip can be connected with optional sites on the power-source related connection electrodes, thus enhancing general versatility of the semiconductor device.

In the case that the power source related connection electrodes are formed in a ring-like pattern so as to surround the periphery of the region where the semiconductor chip is fixedly attached onto the front surface of the resin substrate, the body of the semiconductor chip can be connected directly with the power-source related connection electrodes by extending the region where the electrically conductive adhesive is applied up to the boundaries contacting the power-source related connection electrodes, as well as by using the electrically conductive adhesive as the adhesive.

In the case where through holes for heat radiation are provided in the region of the resin substrate where the semiconductor chip is fixedly attached, and a terminal for heat radiation is provided at the openings of the respective through holes for heat radiation, facing the back surface of the resin substrate, heat generated in the semiconductor chip can be radiated more efficiently via the through holes and the terminals for heat radiation.

The above and other objects, features, and advantages of the invention will be apparent from the following detailed description which is to be read in conjunction with the accompanying drawings.

DETAILED DESCRIPTION OF THE PREFERRED EMBODIMENTS

Embodiments of a semiconductor device according to the invention will be described hereinafter with reference to the accompanied drawings.

First Embodiment

Figure 1:
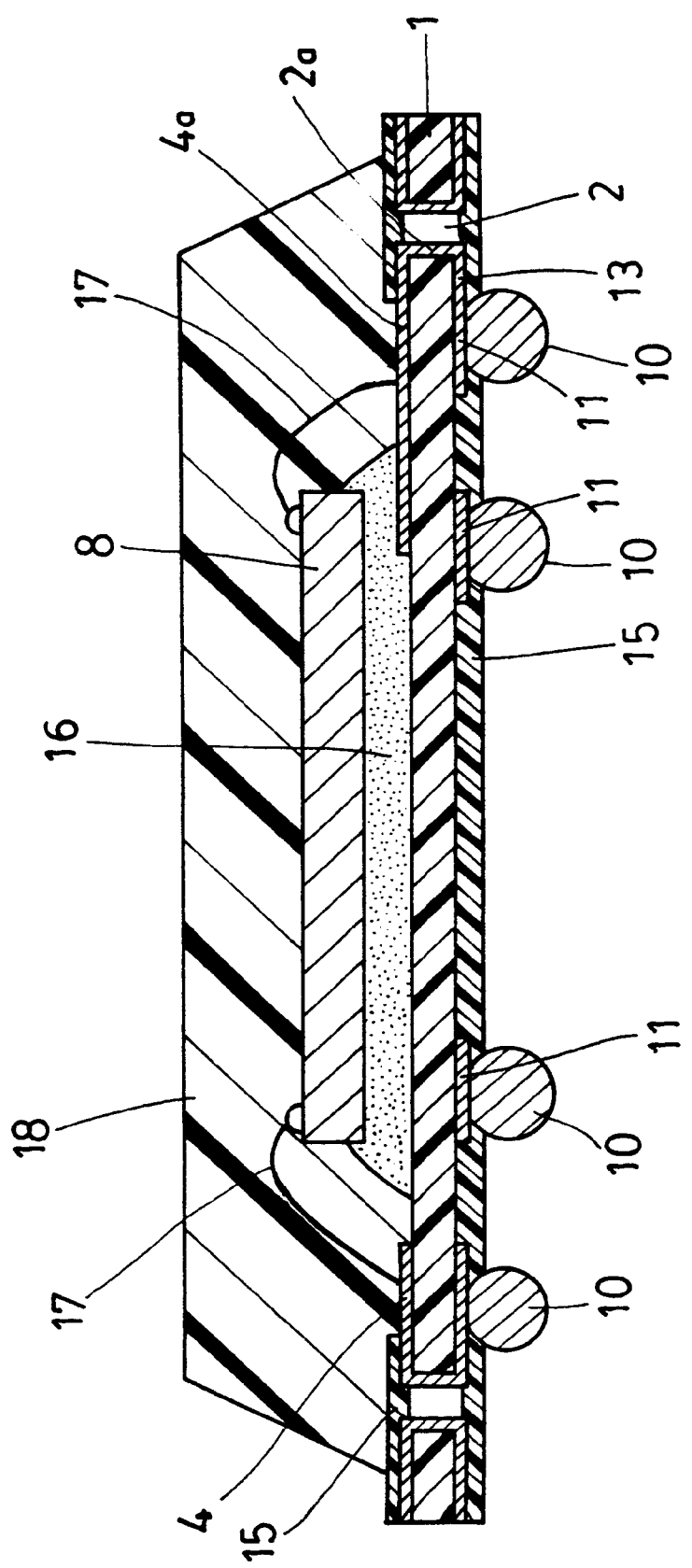
FIG. 1 is a sectional view showing the structure of a semiconductor device according to a first embodiment of the invention.
Figure 2:
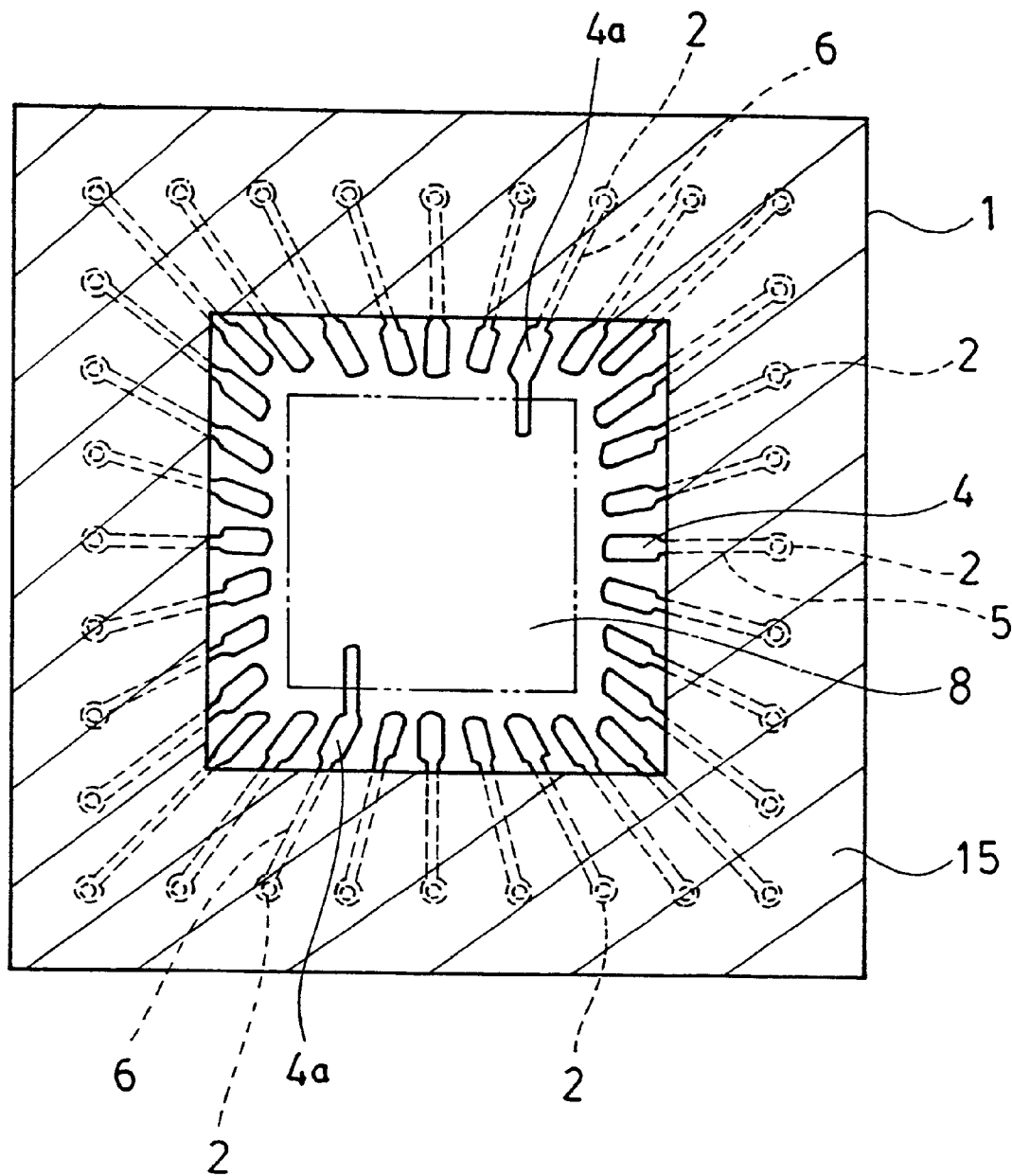
FIG. 2 is a plan view showing the front surface of a resin substrate, a component of the semiconductor device shown in FIG. 1.
Figure 3:
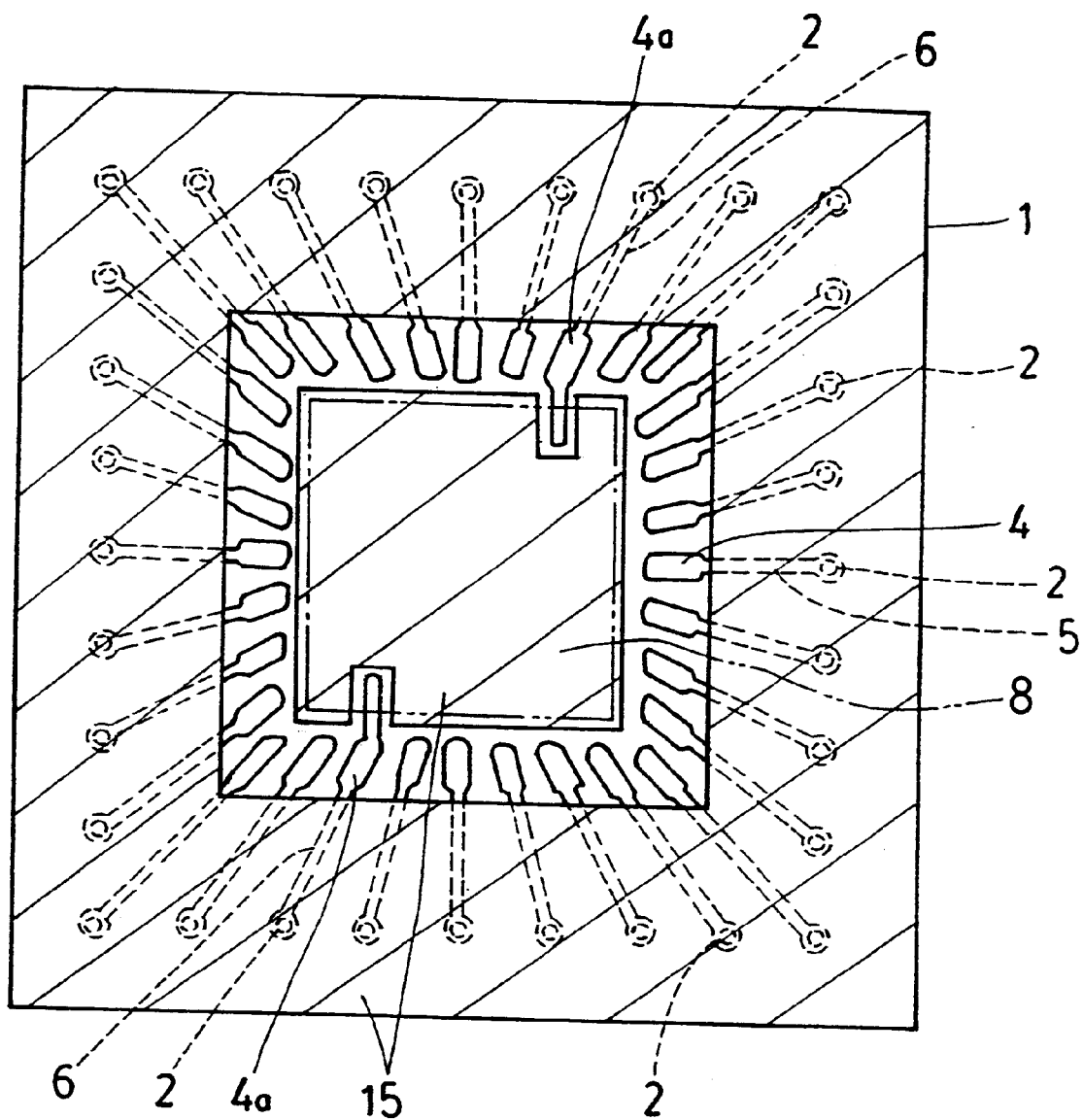
FIG. 3 is a plan view showing the front surface of a resin substrate, a component of the semiconductor device according to a modification of the first embodiment of the invention.

FIGS. 1 to 3

Figure 11:
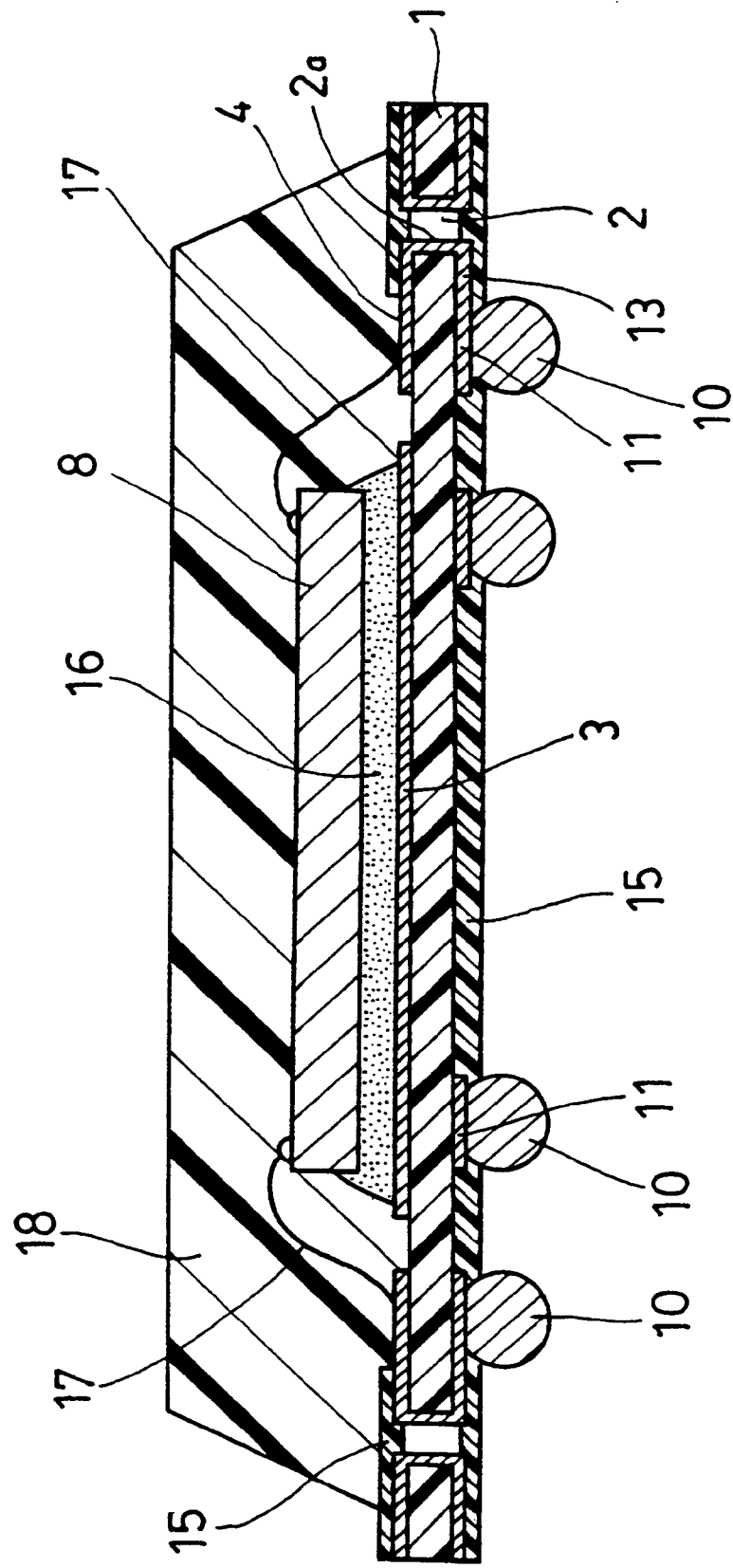
FIG. 11 is a sectional view showing the structure of a conventional semiconductor device.
Figure 12:
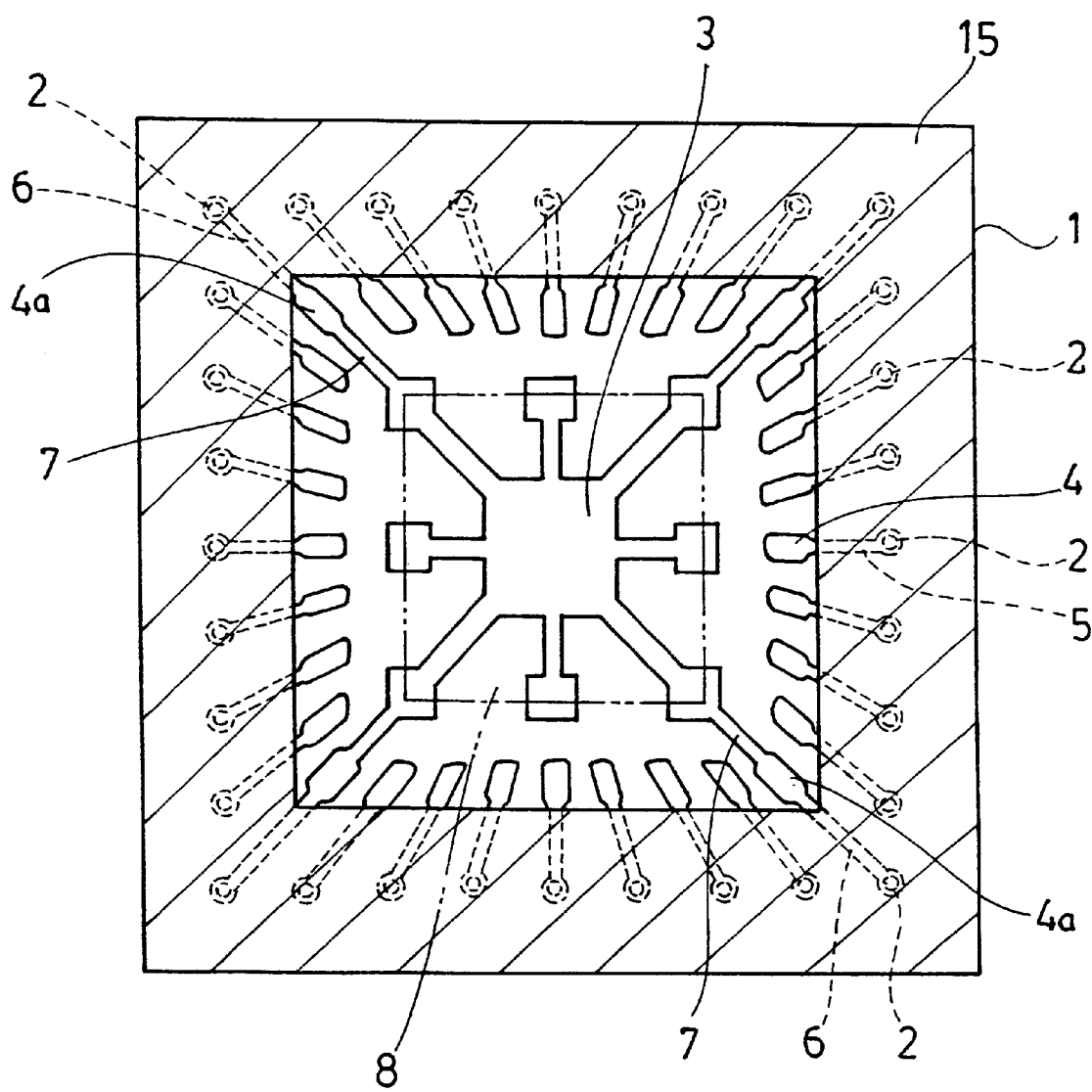
FIG. 12 is a plan view showing the front surface of a resin substrate, a component of the semiconductor device shown in FIG. 11.

FIG. 1 is a sectional view showing the structure of a semiconductor device according to a first embodiment of the invention, and FIG. 2 a plan view showing the front surface of a resin substrate, a component of the semiconductor device. In these figures, parts corresponding to those previously described with reference to FIG. 11 or 12 are denoted by the same reference numerals.

In the semiconductor device according to the first embodiment, a resin substrate 1 is used as a substrate for mounting a semiconductor chip 8 thereon. The resin substrate 1 is formed in a substantially square pattern from a resin material on the order of 0.2 mm in thickness. For the plastic material composing the resin substrate 1, a resin material such as epoxy resin, polyimide resin, or the like, and preferably, epoxy resin impregnated with glass fiber is used.

The semiconductor chip 8 is securely attached onto the central region (a region indicated by the imaginary line in FIG. 2) on the front surface of the resin substrate 1 with the use of an electrically conductive adhesive 16. The electrically conductive adhesive 16 is composed of a resin compound containing fillers having excellent thermal conductivity as well as excellent electrical conductivity. As the fillers with excellent thermal conductivity as well as electrical conductivity, fine powders of a metal such as gold, silver, copper, or the like are cited. As the main component of the resin compound, epoxy resin, phenol resin, polyimide resin, urethane resin, acrylic resin, or the like is cited. For example, the electrically conductive adhesive 16 may be composed of a material containing epoxy resin as the main component thereof and fine powders of silver as the fillers.

In the first embodiment, the resin substrate 1 is exposed in the central region of the front surface thereof, where the semiconductor chip 8 is to be securely attached. However, the die pattern 3 provided in the conventional semiconductor device as shown in FIGS. 11 and 12 is not formed. Consequently, the semiconductor chip 8 is directly adhered to the resin substrate 1 with the electrically conductive adhesive 16. The resin substrate 1 and the electrically conductive adhesive 16, both made of resin materials as there respective main components, have excellent adhesion with each other so that there will be no risk of exfoliation occurring owing to strong bonding therebetween.

The resin substrate 1 is provided with through holes 2 at predetermined locations and a copper-plated layer 2a is formed on the inner surfaces of the respective through holes 2.

Further, as shown in FIG. 2, connection electrodes 4 and power-source related connection electrodes 4a are formed of a copper-plated layer, and disposed around the periphery of the region on the front surface of the resin substrate 1, where the semiconductor chip 8 is to be securely attached. The connection electrodes 4 and the power-source related connection electrodes 4a are electrically continuous with the copper-plated layer 2a formed inside the through holes 2 via conduction paths 5 and 6, both formed of a copper-plated layer.

In this connection, it is desirable to form a nickel (Ni)-plated layer about 2 to 5 $\mu$m in thickness on the front surfaces of the connection electrodes 4 and the power-source related connection electrodes 4a, and further, to form a gold (Au)-plated layer on the order of 0.5 $\mu$m in thickness on top of the nickel (Ni)-plated layer. The nickel (Ni)-plated layer and gold (Au)-plated layer prevent oxidation of the respective electrodes 4 and 4a formed of a copper-plated layer, ensuring excellent electrical connection.

Furthermore, an insulating resin film 15 composed of a resin material such as epoxy resin, or the like is formed over the front surface of the resin substrate 1 in order to protect the each conduction path 5 and 6. However, the connection electrodes 4 and the power-source related connection electrodes 4a are exposed from the insulating resin film 15. That is, the insulating resin film 15 is formed in a region outside of areas of the connection electrodes 4 and the power-source related connection electrodes 4a. In FIG. 2, the region where the insulating resin film 15 is formed is indicated by hatching.

On the other hand, on the back surface of the resin substrate 1, pad electrodes 11 composed of a copper-plated layer are formed at predetermined locations, and a solder ball terminals 10 are soldered to each of the pad electrodes 11. The pad electrodes 11 are electrically continuous with the copper-plated layer 2a inside the through holes 2 via respective conduction paths 13 composed of a copper-plated layer. The solder ball terminals 10 are used for making connection with wiring patterns on the mother board of various electronic equipment not shown in the figures. As a material for the solder ball terminals 10, a solder consisting of lead (Pb) and tin (Sn) mixed, for example, at a weight ratio of 6 to 4, is used.

On the entire back surface of the resin substrate 1, excluding regions where the pad electrodes 11 are formed, the insulating resin film 15 is formed. The pad electrodes 11 are exposed from the insulating resin film 15.

Further, it is desirable to form a nickel (Ni)-plated layer about 2 to 5 $\mu$m in thickness on the front surface of the plural pad electrodes 11 in the same manner as for the plural connection electrodes 4 and the power-source related connection electrodes 4a, and further, to form a gold (Au)-plated layer having excellent conductivity to a thickness on the order of 0.5 $\mu$m on top of the respective nickel (Ni)-plated layers.

In the first embodiment as shown in FIG. 2, the power-source related connection electrodes 4a are extended up to the region on the front surface of the resin substrate 1, where the semiconductor chip 8 is to be fixedly attached (the region indicated by the imaginary line in FIG. 2). Accordingly, electrical continuity of the body of the semiconductor chip 8 with the power-source related connection electrodes 4a via the electrically conductive adhesive 16 is ensured without the formation of the die pattern 3 (refer to FIGS. 11 and 12). Consequently, the body of the semiconductor chip 8 will be at the same potential as that of the power-source related connection electrodes 4a so that the semiconductor chip 8 can be shielded and protected from ambient noise.

Further, the power-source related connection electrodes 4a are electrically continuous with the solder ball terminals 10 via the conduction paths 6, the copper-plated layers 2a inside the through holes 2, the conduction paths 13, and the pad electrodes 11. Since the solder ball terminals 10 are electrically connected with the wiring patterns provided on the mother board of various electronic equipment, heat generated in the semiconductor chip 8 can be radiated to the mother board via a path from the power-source related connection electrodes 4a to the solder ball terminals 10.

That is, with the structure of the semiconductor device according to the first embodiment, a countermeasure against noise generated in the semiconductor chip 8 and improvement in heat radiation can be achieved without forming the die pattern 3 (refer to FIGS. 11 and 12) on the resin substrate 1, further eliminating the problem of exfoliation occurring in the presence of the die pattern 3.

Plural electrodes (excluding either of power-source related electrodes on the ground side or power-source side) of the semiconductor chip 8 are electrically connected with the connection electrodes 4 on the resin substrate 1. While, the power-source related electrodes of the semiconductor chip 8, either on the ground or power-source sides, not connected with the connection electrodes 4, are electrically connected with the power-source related connection electrodes 4a on the resin substrate 1. Of connecting means for the electrodes described above, including the tape automated bonding (TAB) connection and wire bonding connection, it is desirable to use the wire bonding connection in the semiconductor device according to the first embodiment. In the first embodiment shown in FIG. 1, the electrodes of the semiconductor chip 8 are connected with the connection electrodes 4 and the power-source related connection electrodes 4a, respectively, with connecting wires 17. It is desirable to use gold (Au) wire excellent in conductivity for the connecting wires 17.

The semiconductor chip 8 and the connecting wires 17 are sealed by means of the transfer molding process using a thermosetting sealing resin 18 with the aim of shielding from light and protecting the semiconductor chip 8. As a material for the sealing resin 18, a thermosetting resin compound containing fine powders of glass, silica, and the like is used. For the thermosetting resin compound, epoxy resin and silicone resin (preferably, epoxy resin) are cited.

Now, a method of fabricating the semiconductor device according to the first embodiment described above will be explained hereinafter.

Firstly, a copper foil layer on the order of 18 $\mu$m in thickness is provided on the front and back surfaces of the resin substrate 1, and a plurality of through holes 2 are formed in the resin substrate 1 by drilling means such as a cutting drill, or the like.

Then, all the surfaces of the resin substrate 1, including the sidewall faces of the through holes 2, are rinsed, and copper-plated layers are formed on the entire surface of the resin substrate 1 by means of electroless plating and electroplating. The copper-plated layers are formed inside the through holes 2 as well.

Thereafter, an etching treatment is applied to the resin substrate 1 by use of an etching mask pattern and an etchant. As a result of the etching treatment, the connection electrodes 4, the power-source related connection electrodes 4a, the conduction paths 5 for electrical connection of the connection electrodes 4 with the through holes 2, and the conduction paths 6 for electrical connection of the power-source related connection electrodes 4a with the through holes 2 are formed of the copper-plated layer on the front surface of the resin substrate 1 as shown in FIG. 2.

Meanwhile, also as a result of the etching treatment described in the foregoing, on the back surface of the resin substrate 1, the pad electrodes 11 for soldering the solder ball terminals 10 thereto are formed of the copper-plated layer as shown in FIG. 1. Further, as a result of the etching treatment, the conduction paths 13 for electrical connection of the pad electrodes 11 with the through holes 2 are also formed of the copper-plated layer on the back surface of the resin substrate 1.

The connection electrodes 4 and pad electrodes 11, described above, are electrically connected with one another via the copper-plated layer 2a formed inside the through holes 2. The power-source related connection electrodes 4a and pad electrodes 11 are also electrically connected with one another via the copper-plated layer 2a formed inside the through holes 2.

Then, the insulating resin film 15 is formed of a material such as epoxy resin, and the like, on the front and back surfaces of the resin substrate 1 to which the etching treatment has been applied.

In this connection, the insulating resin film 15 is not formed in the center area on the front surface of the resin substrate 1, keeping the connection electrodes 4 and the power-source related connection electrodes 4a exposed. In FIG. 2, the hatched area indicates a region where the insulating resin film 15 is formed. Further, the insulating resin film 15 is not formed in portions of the back surface of the resin substrate 1, for the pad electrodes 11, keeping the pad electrodes 11 exposed.

Subsequently, a nickel (Ni)-plated layer (not shown) on the order of 2 to 5 μm is formed on the surfaces of the connection electrodes 4, the power-source related connection electrodes 4a, and the pad electrodes 11, and further, which are thereby exposed from the insulating resin film 15, and a gold (Au)-plated layer (not shown) excellent in conductivity is formed to a thickness on the order of 0.5 μm on top of the nickel (Ni)-plated layer.

The semiconductor chip 8 is fixedly attached onto the resin substrate 1 with the use of the electrically conductive adhesive 16.

Then, both signal related electrodes and power-source electrodes (either of the power-source related electrode on the ground side or power-source side) of the semiconductor chip 8 are connected with the connection electrodes 4 by the connecting wires 17. The power-source related electrodes of the semiconductor chip 8, on either side, not connected with the connection electrodes 4, are connected with the power-source related connection electrodes 4a by the connecting wires 17.

Subsequently, the semiconductor chip 8 and the connecting wires 17 are sealed by the transfer molding process using the thermosetting sealing resin 18, and the solder ball terminals 10 are fused to each of the pad electrodes 11 formed on the back surface of the resin substrate 1.

The results of experiments conducted by the inventors show that in the case where a semiconductor chip 8, being 10 mm square, was fixedly attached onto the die pattern 3 with a gold (Au)-plated layer formed on the surface thereof, according to the conventional technology (of the semiconductor device as shown in FIGS. 11 and 12), with the use of the electrically conductive adhesive 16, composed of epoxy resin as its main component and containing fine silver powders, the die shear strength as measured at 200° C. was 17 kgf.

In the case of the embodiment of the invention wherein a semiconductor chip 8, being 10 mm square, was fixedly attached directly onto the resin substrate 1 composed of epoxy resin impregnated with fiber glass with the use of the electrically conductive adhesive 16, composed of epoxy resin as its main component and containing fine silver powders, similar to the aforesaid case, the die shear strength as measured at 200° C. was 41 kgf.

Thus, with the semiconductor device according to this embodiment, the adhesive strength is enhanced by fixedly attaching the semiconductor chip 8 directly to the resin substrate 1 with the use of the electrically conductive adhesive 16 composed of a resin compound. Consequently, even if a shearing force is caused to occur between the semiconductor chip 8 and the resin substrate 1 due to heating of the semiconductor device, exfoliation therebetween can be inhibited.

In the semiconductor device according to the first embodiment described above, the power-source related connection electrodes 4a are extended to the region on the resin substrate 1 (indicated by the imaginary line in FIG. 2) where the semiconductor chip 8 is fixedly attached. However, the structure thereof may be altered such that the power source related connection electrodes 4a are not extended up to the aforesaid region.

In this instance, the effect of shielding the semiconductor chip 8 and the effect of good heat radiation can not be obtained. Still, the effect of preventing exfoliation from occurring between the semiconductor chip 8 and the resin substrate 1, which is the object of the invention, can be achieved by directly bonding the former with the latter.

With the structure wherein the power-source related connection electrodes 4a are not extended up to the region described above, an adhesive composed of a resin compound which is electrically non-conductive may be used. As a material for this type of adhesive, an adhesive resin compound composed of epoxy resin, phenol resin, polyimide resin, urethane resin, acrylic resin, or the like as the main component thereof is cited. A preferable material among them is an adhesive resin compound composed of epoxy resin as the main component thereof.

FIG. 3 is a plan view showing the front surface of a resin substrate, a component of the semiconductor device according to a modification of the first embodiment of the invention described in the foregoing.

In the modification of the first embodiment shown in the same figure, the insulating resin film 15 composed of a resin material such as epoxy resin, or the like is formed in the region (as indicated by the imaginary line in FIG. 3) provided in the center area of the front surface of the resin substrate 1, where the semiconductor chip 8 is fixedly attached. However, in the case where the power-source related connection electrodes 4a are extended up to the region where the semiconductor chip 8 is fixedly attached, the insulating resin film 15 is not formed in regions where the power-source related connection electrodes 4a are formed.

As in the case of the first embodiment described above, wherein the semiconductor chip 8 is fixedly attached directly to the resin substrate 1, air bubbles are prone to be generated between the resin substrate 1 and the electrically conductive adhesive 16 (or the electrically non-conductive adhesive) due to the presence of minute irregularities on the front surface of the resin substrate 1.

On the other hand, with the structure according to the modification of the first embodiment, the insulating resin film 15 is formed in the region where the semiconductor chip 8 is fixedly attached. Hence, the electrically conductive adhesive 16 (or the electrically non-conductive adhesive) will be bonded with the insulating resin film 15. Since both the electrically conductive adhesive 16 (or the electrically nonconductive adhesive) and the insulating resin film 15 are composed of resin compounds as respective main components, strong adhesion can be attained therebetween. In addition, since the front surface of the insulating resin film 15 is very smooth, there will be only a small chance of air bubbles being formed at the interface between the insulating resin film 15 and the electrically conductive adhesive 16 (or the electrically non-conductive adhesive).

As a result, with the semiconductor device according to the modification, stronger adhesion is obtained as compared with the case of the first embodiment while occurrence of exfoliation due to the ingress of water into the air bubbles is inhibited, thereby further enhancing reliability of the semiconductor device.

Second Embodiment

Figure 4:
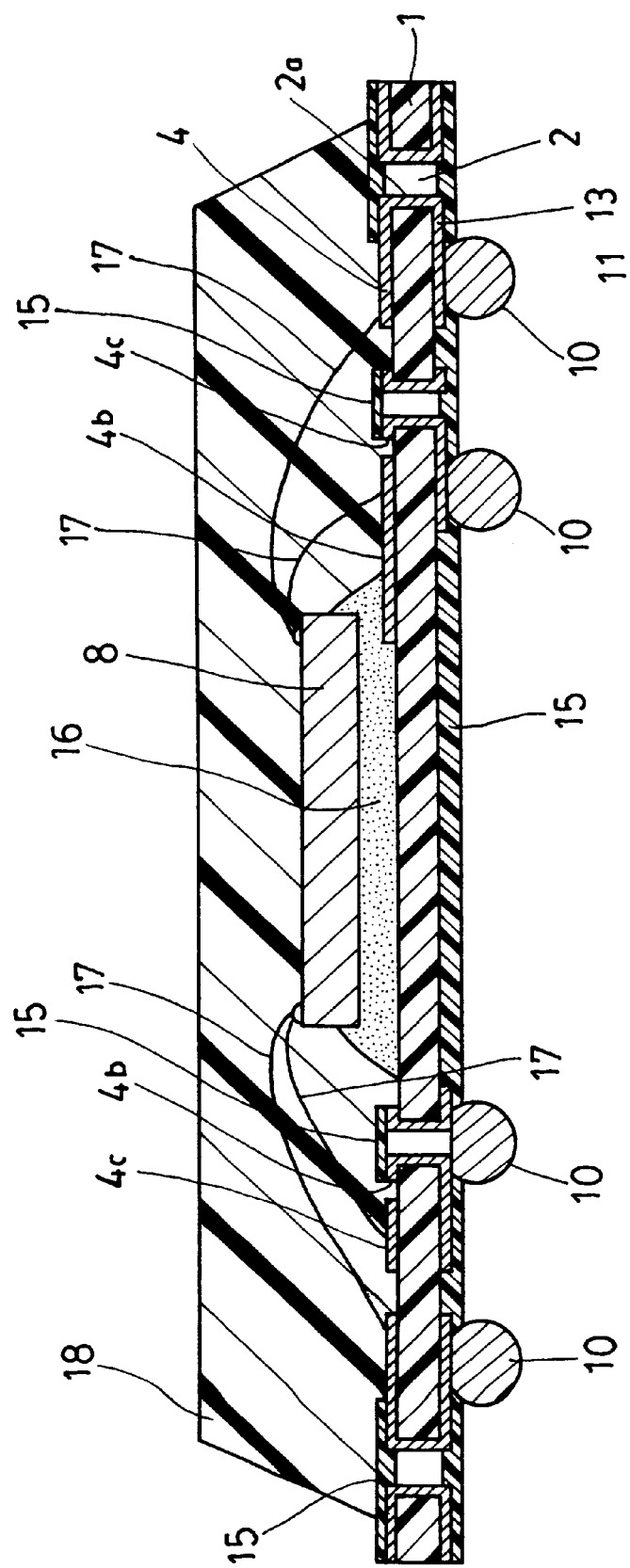
FIG. 4 is a sectional view showing the structure of a semiconductor device according to a second embodiment of the invention.
Figure 5:
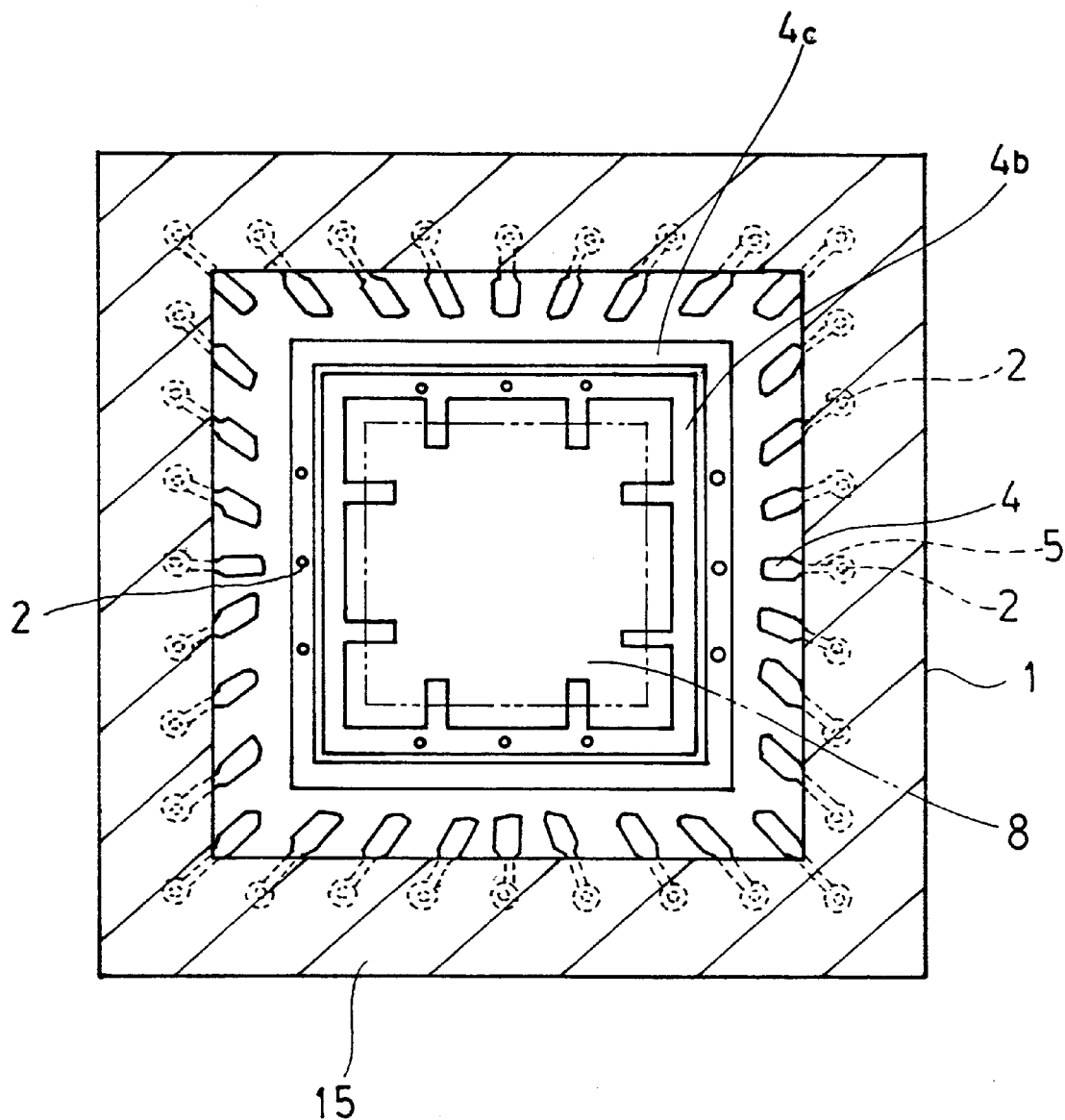
FIG. 5 is a plan view showing the front surface of a resin substrate, a component of the semiconductor device shown in FIG. 4.
Figure 6:
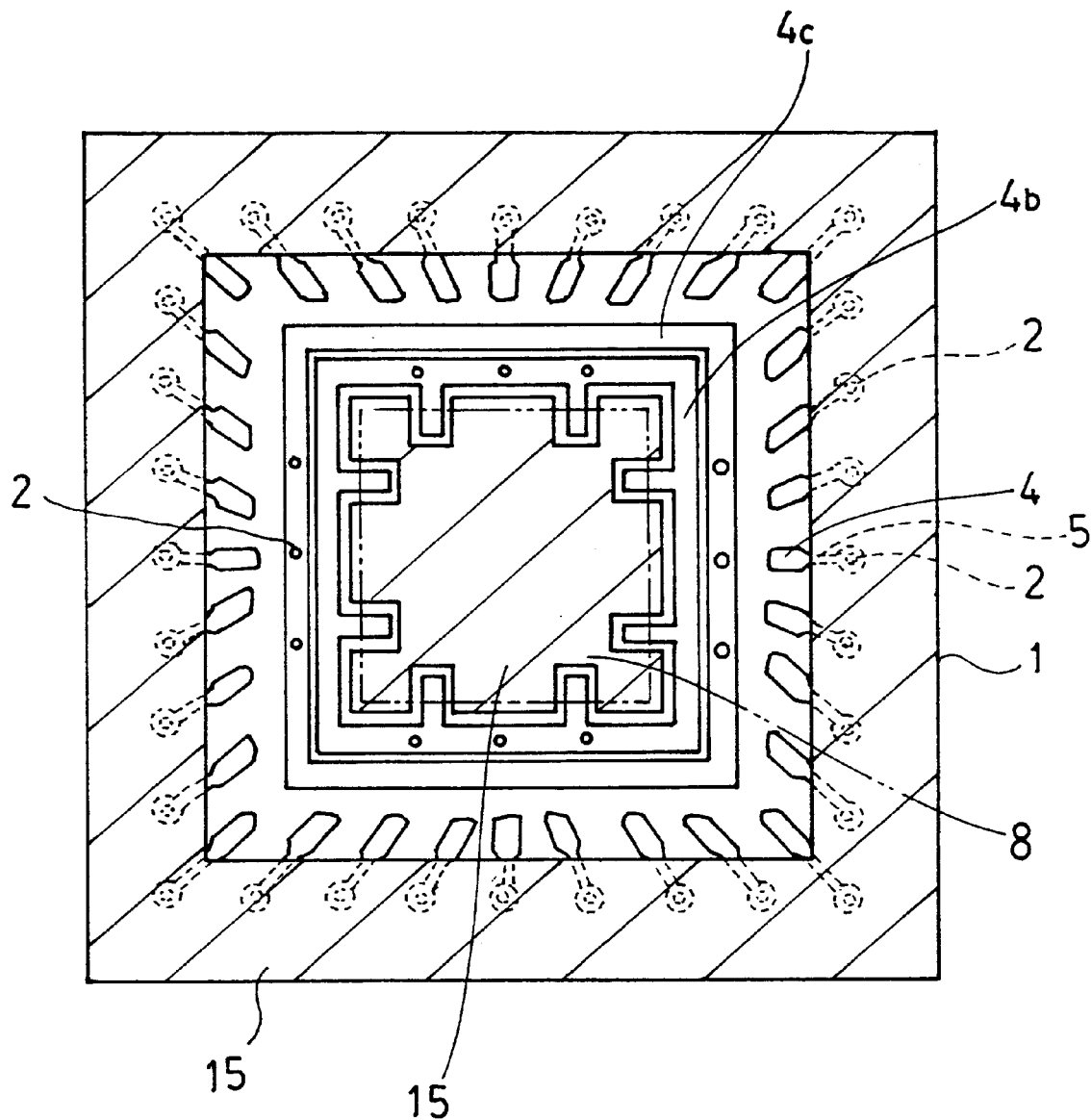
FIG. 6 is a plan view showing the front surface of a resin substrate, a component of the semiconductor device according to a modification of the second embodiment of the invention.

FIGS. 4 to 6

FIG. 4 is a sectional view showing the structure of a semiconductor device according to a second embodiment of the invention, and FIG. 5 is a plan view showing the front surface of a resin substrate, a component of the semiconductor device. In these figures, parts corresponding to those previously described with reference to FIG. 1 or 2 are denoted by the same reference numerals.

In the semiconductor device according to the second embodiment as well, the resin substrate 1 is used as the substrate for mounting the semiconductor chip thereon. The resin substrate 1 is formed in a substantially square pattern from a resin material on the order of 0.2 mm in thickness. As a material composing the resin substrate 1, a resin material such as epoxy resin, polyimide resin, or the like, and preferably, epoxy resin impregnated with glass fiber, is used.

The semiconductor chip 8 is fixedly attached to the central region (as indicated by the imaginary line in FIG. 5) on the front surface of the resin substrate 1 with the use of an electrically conductive adhesive 16. The electrically conductive adhesive 16 is composed of a resin compound containing fillers having excellent thermal conductivity as well as electrical conductivity. As the fillers with excellent thermal conductivity as well as electrical conductivity, fine powders of a metal such as gold, silver, copper, and the like are cited. As the main component of the resin compound, epoxy resin, phenol resin, polyimide resin, urethane resin, acrylic resin, or the like is cited. For example, the electrically conductive adhesive 16 may be composed of a material containing epoxy resin as the main component thereof and fine powders of silver as the fillers.

In the second embodiment as well, the resin substrate 1 is exposed in the central region on the front surface thereof, where a semiconductor chip 8 is to be fixedly attached, and further, the die pattern 3 provided in the conventional semiconductor device as shown in FIGS. 11 and 12 is not formed. Consequently, the semiconductor chip 8 is directly bonded to the resin substrate 1 with the electrically conductive adhesive 16. The resin substrate 1 and the electrically conductive adhesive 16, both composed of resin materials as respective main components, have excellent adhesion with each other, precluding a fear of exfoliation owing to strong bonding therebetween.

The resin substrate 1 is provided with a plurality of through holes 2 at predetermined locations and the copper-plated layer 2a is formed on the inner surfaces of the respective through holes 2.

Further, as shown in FIG. 5, a power-source related connection electrode 4b resembling a ring in shape is formed of a copper-plated layer so as to surround the periphery of a region on the front surface of the resin substrate 1 where the semiconductor chip 8 is fixedly attached. Further, in this embodiment, a power-source related connection electrode 4c resembling a ring in shape is formed of a copper-plated layer so as to surround the periphery of the power-source connection electrode 4b.

The through holes 2 described above are provided at a number of locations in regions where the power-source related connection electrodes 4b and 4c are formed, respectively, as well, and the power-source related connection electrodes 4b and 4c are electrically connected directly with the copper-plated layers, respectively, inside the plurality of the through holes 2 formed as described above.

In addition, a plurality of connection electrodes 4 are formed of a copper-plated layer, and disposed around the periphery of the power-source related connection electrode 4c. These connection electrodes 4 are electrically continuous with the copper-plated layers 2a inside the through-holes 2 via conduction paths 5 composed of a copper-plated layer.

In this connection, it is desirable to form a nickel (Ni)-plated layer on the order of 2 to 5 µm in thickness on the front surfaces of the connection electrodes 4, the power-source related connection electrodes 4b and 4c, and further, to form a gold (Au)-plated layer excellent in electrical conductivity to a thickness of about 0.5 µm on top of the nickel plated layer. Oxidation of the respective electrodes 4, 4b and 4c, composed of the copper-plated layer, can then be prevented by the nickel (Ni)-plated layer and gold (Au)-plated layer as described above, providing excellent electrical connection.

Further, the insulating resin film 15, composed of a resin material such as epoxy resin, or the like, is formed on the front surface of the resin substrate 1 for protection of the respective conduction paths 5 and 6 described above. The connection electrodes 4 and the power-source related connection electrodes 4b and 4c are exposed from the insulating resin film 15. That is, the insulating resin film 15 is formed in a region outside regions for the connection electrodes 4 and the power-source related connection electrodes 4b and 4c. In FIG. 5, the region where the insulating resin film 15 is formed is indicated by hatching.

On the other hand, pad electrodes 11 composed of a copper-plated layer are formed at predetermined locations on the back surface of the resin substrate 1, and the solder ball terminals 10 are soldered to the pad electrodes 11. The pad electrodes 11 are electrically continuous with the copper-plated layers 2a inside the through holes 2 via conduction paths 13 composed of a copper-plated layer. The solder ball terminals 10 are used for connection with wiring patterns (not shown) on the mother board of various pieces of electronic equipment. As a material for the solder ball terminals 10, a solder consisting of lead (Pb) and tin (Sn), which are mixed, for example, at a weight ratio of 6 to 4, is used.

The insulating resin film 15 is formed on the entire back surface of the resin substrate 1, excluding regions where the pad electrodes 11 are formed. The pad electrodes 11 are exposed from the insulating resin film 15.

Further, it is desirable to form a nickel (Ni)-plated layer about 2 to 5 µm in thickness also on the front surface of the each pad electrode 11 as well in the same manner as for the front surfaces of the connection electrodes 4 and power-source related connection electrodes 4b and 4c, and to further form a gold (Au)-plated layer having excellent electrical conductivity to a thickness on the order of 0.5 µm on top of the nickel (Ni)-plated layer.

As shown in FIG. 5, in the second embodiment, the power source related connection electrode 4b is extended up to the region (as indicated by the imaginary line in FIG. 5) where the semiconductor chip 8 is fixedly attached. Accordingly, without the formation of the die pattern 3 (refer to FIGS. 11 and 12), it is ensured that the body of the semiconductor chip 8 is electrically continuous with the power-source related connection electrode 4b via the electrically conductive adhesive 16. Consequently, the body of the semiconductor chip 8 will be at the same potential as that of the power-source related connection electrode 4b, enabling the semiconductor chip 8 to be shielded so as to be protected from ambient noise.

Furthermore, the power-source related connection electrode 4b is electrically continuous with a plurality of the solder ball terminals 10 via the copper-plated layer 2a inside the respective through holes 2, the conduction paths 13, and the pad electrodes 10. Since the solder ball terminals 10 will be connected with wiring patterns formed on the mother board of various pieces of electronic equipment, heat generated in the semiconductor chip 8 will be radiated to the mother board via a path from the power-source related connection electrode 4b to the solder ball terminals 10.

In this embodiment, a multitude of paths for heat radiation are provided as the semiconductor chip is electrically continuous with the plurality of solder ball terminals 10 via the copper-plated layers 2a formed inside the plurality of through holes 2. Therefore, sufficient heat radiation can be achieved.

That is, with the structure of the semiconductor device according to the second embodiment as well, a countermeasure against noises generated in the semiconductor chip 8 and improvement in heat radiation can be achieved without the die pattern 3 (refer to FIGS. 11 and 12) formed on the resin substrate 1, and furthermore, the problem of exfoliation occurring due to the presence of the die pattern 3 is solved.

Plural electrodes of the semiconductor chip 8 (excluding either of power-source related electrodes on the ground side or power-source side) are electrically connected with the connection electrodes 4 on the resin substrate 1. The power-source related electrodes of the semiconductor chip 8, either on the ground side or the power-source side, not connected with the connection electrodes 4, are connected with the power-source related connection electrodes 4b or 4c on the resin substrate 1.

As means for effecting connections as described above, there are the tape automated bonding (TAB) connection, wire bonding connection, and the like. However, in the case of the semiconductor device according to this embodiment, the wire bonding connection preferably should be used. As shown in FIG. 4, in the second embodiment of the invention, the plural electrodes of the semiconductor chip 8 are connected with the connection electrodes 4, and the power-source related connection electrodes 4b and 4c, by use of the connecting wires 17. As a material for the connecting wires 17, a gold (Au) wire excellent in electrical conductivity may preferably be used.

With the structure according the second embodiment, wherein the power-source related connection electrode 4b and 4c are formed in a ring-like pattern, respectively, there will be no need for altering the electrode patterns on the resin substrate 1 even when surface mounting the semiconductor chip 8 provided with the power-source electrodes arranged in a different configuration, and connection can be made at optional sites on the power-source related connection electrodes 4b and 4c via the connecting wires 17, enhancing general versatility of the semiconductor device.

The semiconductor chip 8 and the connecting wires 17 are sealed by means of the transfer molding process using a thermosetting sealing resin 18 with the aim of shielding from light and protecting the semiconductor chip 8. As a material for the sealing resin 18, a thermosetting resin compound containing fine powders of glass, silica, and the like can be used. For the thermosetting resin compound, epoxy resin and silicone resin (preferably, epoxy resin) can be used.

With the semiconductor device according to the aforesaid embodiment as well, adhesion is enhanced by fixedly attaching the semiconductor chip 8 directly to the resin substrate 1 with the use of the electrically conductive adhesive 16 composed of a resin compound in the same manner as in the case of the first embodiment. Consequently, even if a shearing force is caused to occur between the semiconductor chip 8 and the resin substrate 1 due to heating of the semiconductor device, exfoliation therebetween can be inhibited.

Further, in the semiconductor device according to the second embodiment described above, the power-source related connection electrodes 4b are extended to the region (as indicated by the imaginary line in FIG. 2) on the resin substrate 1 where the semiconductor chip 8 is fixedly attached. However, the structure thereof may be altered such that the power-source related connection electrodes 4b are not extended up to the aforesaid region.

In this case, the effect of shielding the semiconductor chip 8 and the effect of heat radiation cannot be attained. Still the effect of preventing exfoliation from occurring between the semiconductor chip 8 and the resin substrate 1, which is the object of the invention, can be achieved by directly bonding the former with the latter.

With the structure wherein the power-source related connection electrodes 4b are not extended up to the region described above, an adhesive composed of a resin compound which is electrically non-conductive may be used. As a material for this type of adhesive, an adhesive resin compound composed of epoxy resin, phenol resin, polyimide resin, urethane resin, acrylic resin, or the like as the main component thereof can be used. A preferable material among those mentioned is an adhesive resin compound composed of epoxy resin as the main component thereof.

FIG. 6 is a plan view showing the front surface of the resin substrate, a component of a semiconductor device according to a modification of the second embodiment described above.

In the modification of the second embodiment shown in the same figure, the insulating resin film 15 composed of a resin material such as epoxy resin, or the like is formed in the region (as indicated by the imaginary line in FIG. 6) defined in the center area on the front surface of the resin substrate 1, where the semiconductor chip 8 is fixedly attached. However, in case that the power-source related connection electrodes 4b are extended up to the region where the semiconductor chip 8 is fixedly attached, the insulating resin film 15 is not formed in regions where the power-source related connection electrodes 4b are formed.

In the case where the semiconductor chip 8 is fixedly attached directly to the resin substrate 1 as in the case of the second embodiment previously described, air bubbles are prone to be generated between the resin substrate 1 and the electrically conductive adhesive 16 (or the electrically non-conductive adhesive) due to the presence of minute irregularities on the front surface of the resin substrate 1.

On the other hand, with the structure according to the modification of the second embodiment, the insulating resin film 15 is formed in the region where the semiconductor chip 8 is fixedly attached, and accordingly, the electrically conductive adhesive 16 (or the electrically non-conductive adhesive) will be bonded with the insulating resin film 15. Both the electrically conductive adhesive 16 (or the electrically non-conductive adhesive) and the insulating resin film 15 are composed of resin compounds as respective main components, and strong bonding can be achieved therebetween. In addition, since the front surface of the insulating resin film 15 is highly smooth, there will be only a small chance of air bubbles being formed at an interface between the insulating resin film 15 and the electrically conductive adhesive 16 (or the electrically non-conductive adhesive).

As a result, with the semiconductor device according to the modification, stronger adhesion is obtained as compared with the case of the second embodiment while occurrence of exfoliation due to the ingress of water into the air bubbles is inhibited, thereby further enhancing reliability of the semiconductor device.

Third Embodiment

FIGS. 7 to 10

Figure 7:
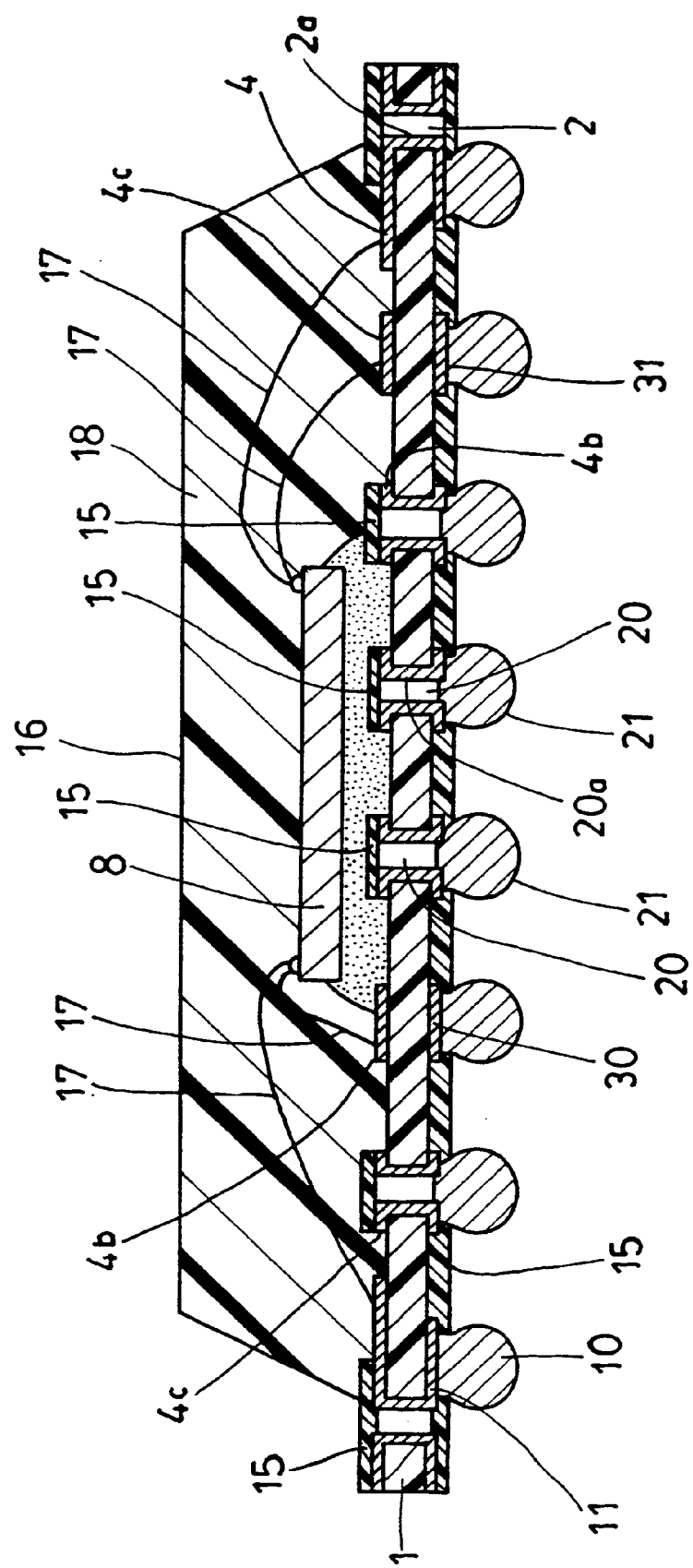
FIG. 7 is a sectional view showing the structure of a semiconductor device according to a third embodiment of the invention.
Figure 8:
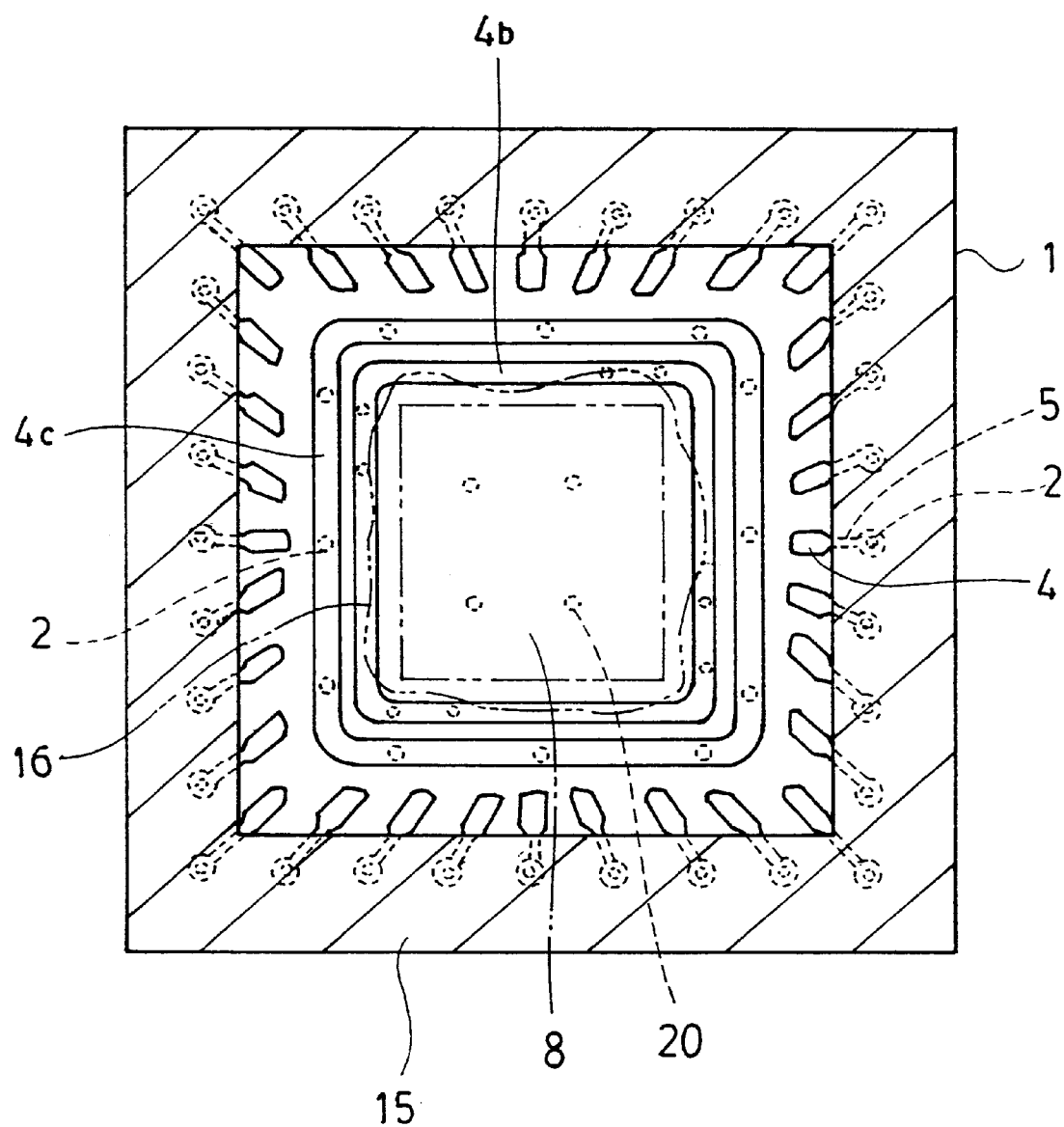
FIG. 8 is a plan view showing the front surface of a resin substrate, a component of the semiconductor device shown in FIG. 7.
Figure 9:
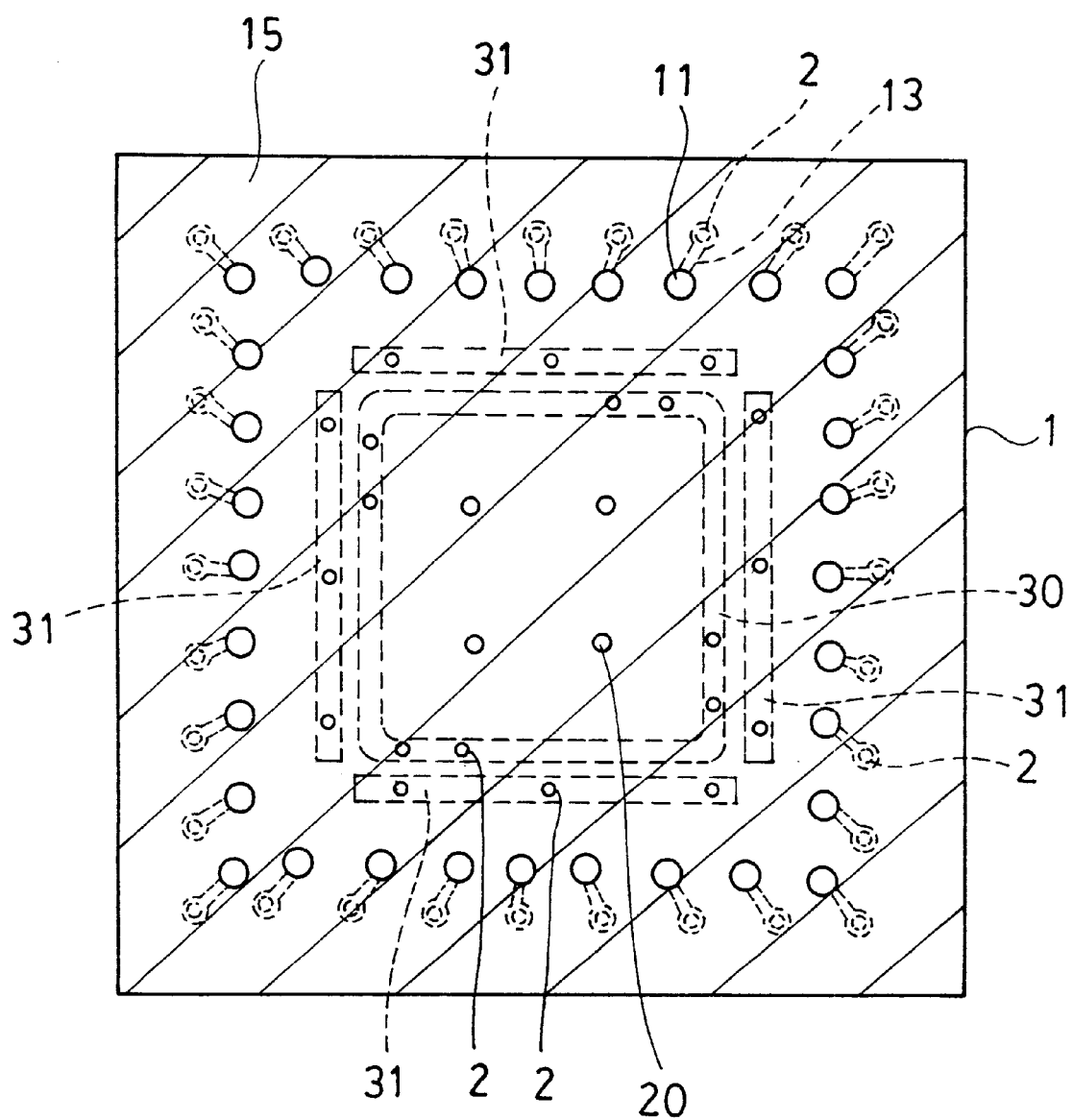
FIG. 9 is a plan view showing the back surface of a resin substrate, a component of the semiconductor device shown in FIG. 7.

FIG. 7 is a sectional view showing the structure of a semiconductor device according to a third embodiment of the invention, FIG. 8 is a plan view showing the front surface of a resin substrate, a component of the semiconductor device, and FIG. 9 is a bottom view showing the back surface of the resin substrate a component of the semiconductor device. In these figures, parts corresponding to those previously described with reference to FIG. 4 or 5 are denoted by the same reference numerals.

In the semiconductor device according to this embodiment as well, the resin substrate 1 is used as the substrate for mounting the semiconductor chip 8 thereon. The resin substrate 1 is formed in a substantially square pattern from a resin material on the order of 0.2 mm in thickness. For the resin material composing the resin substrate 1, a resin material such as epoxy resin, polyimide resin, or the like, preferably, epoxy resin impregnated with glass fiber is used.

The semiconductor chip 8 is fixedly attached to the central region (as indicated by the imaginary line in FIG. 5) on the front surface of the resin substrate 1 with the use of the electrically conductive adhesive 16. The electrically conductive adhesive 16 is composed of a resin compound containing fillers having excellent thermal conductivity as well as electrical conductivity. As the fillers with excellent thermal conductivity as well as electrical conductivity, fine powders of a metal such as gold, silver, copper, and the like can be used. As the main component of the resin compound, epoxy resin, phenol resin, polyimide resin, urethane resin, acrylic resin, or the like can be used. For example, the electrically conductive adhesive 16 may be composed of a material containing epoxy resin as the main component thereof and fine powders of silver as the fillers.

In the third embodiment as well, the resin substrate 1 is exposed in the central region of the front surface thereof, where the semiconductor chip 8 is to be fixedly attached. However, the die pattern 3 provided in the conventional semiconductor device as shown in FIGS. 11 and 12 is not formed. Consequently, the semiconductor chip 8 is directly adhered to the resin substrate 1 with the use of the electrically conductive adhesive 16. The resin substrate 1 and the electrically conductive adhesive 16, both composed of resin materials as respective main components, have excellent adhesion with each other, precluding a fear of exfoliation owing to strong bonding therebetween.

The resin substrate 1 is provided with the plurality of through holes 2 at predetermined locations and the copper-plated layer 2a is formed on the inner surfaces of the respective through holes 2.

In the third embodiment, a plurality of through holes 20 for heat radiation are provided in the region where the semiconductor 8 is fixedly attached onto the resin substrate 1, and a copper-plated layer 2a is formed on the inner surfaces of the through holes 20 for heat radiation, enhancing thermal conductivity.

As shown in FIG. 8, a power-source related connection electrode 4b patterned in a ring-like shape is formed of a copper-plated layer so as to surround the region where the semiconductor chip 8 is fixedly attached onto the front surface of the resin substrate 1. Further, in this embodiment, a power-source related connection electrode 4c patterned in a ring-like shape is formed of the copper-plated layer so as to surround the periphery of the power-source related connection electrode 4b.

The through holes 2 described above are defined at a number of locations in regions where the power-source related connection electrodes 4b and 4c are formed, respectively, as well, and the power-source related connection electrodes 4b and 4c are electrically continuous directly with the copper-plated layer 2a formed inside the plurality of through holes 2, respectively.

In addition, a plurality of connection electrodes 4 formed of a copper-plated layer are disposed around the periphery of the power-source related connection electrode 4c. The connection electrodes 4 are electrically continuous with the copper-plated layers 2a inside the respective through holes 2 via conduction paths 5 composed of a copper-plated layer.

It is desirable to form the nickel (Ni)-plated layer on the order of 2 to 5 μm in thickness on the front surfaces of the connection electrodes 4, the power-source related connection electrodes 4b and 4c, and further, to form a gold (Au)-plated layer excellent in electrical conductivity to a thickness of about 0.5 μm on top of the nickel (Ni)-plated layer. Oxidation of the electrodes 4, 4b and 4c, composed of the copper-plated layer, can then be prevented by the nickel (Ni)-plated layer and gold (Au)-plated layer described above, providing excellent electrical connection.

Further, an insulating resin film 15, composed of a resin material such as epoxy resin, or the like, is formed on the front surface of the resin substrate 1 for protection of the conduction paths 5 and 6 described above. The connection electrodes 4 and the power-source related connection electrodes 4b and 4c are exposed from the insulating resin film 15. That is, the insulating resin film 15 is formed in a region outside the connection electrodes 4 and the power-source related connection electrodes 4b and 4c. In FIG. 8, the region where the insulating resin film 15 is formed is indicated by hatching. The openings of the through holes 20 for heat radiation, on the side of the front surface of the resin substrate 1, are blocked up with the insulating resin film 15, preventing the ingress of the electrically conductive adhesive 16 thereinto.

Meanwhile, pad electrodes 11 composed of a copper-plated layer are formed at predetermined locations on the back surface of the resin substrate 1, and the solder ball terminals 10 are soldered to the pad electrodes 11. The pad electrodes 11 are electrically continuous with the copper-plated layers 2a inside the through holes 2, to be connected with the connection electrodes 4, via conduction paths 13 composed of a copper-plated layer. The solder ball terminals 10 are used for connection with wiring patterns (not shown) on the mother board of various pieces of electronic equipment. As a material for the solder ball terminals 10, a solder consisting of lead (Pb) and tin (Sn), which are mixed, for example, at a weight ratio of 6 to 4, is used.

Further, in this embodiment, as shown in FIG. 9, power-source related patterns 30 and 31 are formed of a copper-plated layer, respectively, on the back surface of the resin substrate 1. The power-source related pattern 30 is electrically continuous with the power-source related connection electrode 4b via the copper-plated layers 2a inside the through holes 2, while the power-source related patterns 31 are electrically continuous with the power-source related connection electrode 4c via the copper-plated layers 2a inside the through holes 2. Solder ball terminals 10 are attached by soldering to the power-source related patterns 30 and 31 at appropriate locations thereof, respectively.

As shown in FIG. 7, the terminals 21 for heat radiation are soldered to respective openings of the through holes 20 for heat radiation, on the back surface side of the resin substrate 1, and the terminals 21 for heat radiation also composed of the same material as that for the solder ball terminals 10 are formed into spheres.

Also, as shown in FIG. 9, the insulating resin film 15 is formed on the entire back surface of the resin substrate 1 except areas where the pad electrodes 11 are formed. The pad electrodes 11 are exposed from the insulating resin film 15.

As in the case of the front surfaces of the connection electrodes 4, and the power-source related connection electrodes 4b and 4c, it is desirable to form a nickel (Ni)-plated layer on the order of 2 to 5 μm in thickness on the front surfaces of the pad electrodes 11 as well, and further, to form a gold (Au)-plated layer excellent in electrical conductivity to a thickness of about 0.5 μm on top of the nickel (Ni)-plated layer.

As shown in FIG. 8, in the third embodiment of the invention, the boundary within which the electrically conductive adhesive 16 is applied to the resin substrate 1 is expanded so as to adjoin to the boundary of the power-source related connection electrode 4b. Consequently, even in the case where the die pattern 3 (refer to FIGS. 11 and 12) is not formed, and the power source-related connection electrode 4b is not extended up to the region where the semiconductor chip 8 is fixedly attached, as in the case of the second embodiment, electrical continuity of the body of the semiconductor chip 8 with the power-source related connection electrode 4b is ensured via the electrically conductive adhesive 16. Consequently, the body of the semiconductor chip 8 will be at the same potential as that of the power-source related connection electrode 4b, enabling the semiconductor chip 8 to be shielded so as to be protected from ambient noise.

Furthermore, the power source related connection electrode 4b is electrically continuous with the plurality of solder ball terminals 10 via the copper-plated layer 2a inside the through holes 2, conduction paths 13, and the pad electrodes 11. Since the solder ball terminals 10 will be connected with wiring patterns formed on the mother board of various pieces of electronic equipment, heat generated in the semiconductor chip 8 will be radiated to the mother board via a path from the power-source related connection electrode 4b to the solder ball terminals 10.

In the third embodiment, a multitude of paths for heat radiation are provided as the semiconductor chip is electrically continuous with the plurality of the solder ball terminals 10 via the copper-plated layers 2a inside the plurality of the through holes 2, and consequently, the effect of sufficient heat radiation can be exhibited.

In addition, in the third embodiment, the plurality of through holes 20 for heat radiation and the terminals 21 for heat radiation are provided in the region where the semiconductor chip 8 is fixedly attached onto the front surface of the resin substrate 1. As a result, heat generated in the semiconductor chip 8 is conducted through the electrically conductive adhesive 16, and radiated to the mother board of the electronic equipment via the through holes 20 for heat radiation and the terminals 21 for heat radiation. Consequently, heat can be radiated more efficiently.

Thus, with the structure of the semiconductor device according to the third embodiment as well, a countermeasure against noise generated in the semiconductor chip 8 and improvement in heat radiation can be achieved without the die pattern 3 (refer to FIGS. 11 and 12) formed on the resin substrate 1, and further, the problem of exfoliation occurring due to the presence of the die pattern 3 can be solved.

Plural electrodes of the semiconductor chip 8 (excluding either of power-source electrodes on the ground side or power-source side) are electrically connected with the connection electrodes 4 on the resin substrate 1. The power source electrodes of the semiconductor chip 8, either on the ground side or the power-source side, not connected with the connection electrodes 4, are connected with the power-source related connection electrode 4b or 4c on the resin substrate 1.

As means for effecting connections described above, there are the tape automated bonding (TAB) connection, wire bonding connection, and the like. However, in the case of the semiconductor device according to this embodiment, the wire bonding connection may preferably be used. As shown in FIG. 7, in the third embodiment of the invention, the respective electrodes of the semiconductor chip 8 are connected with the connection electrodes 4, and the power-source related connection electrode 4b and 4c by use of connecting wires 17. As a material for the connecting wires 17, gold (Au) wire which is excellent in electrical conductivity should preferably be used.

With the structure of the semiconductor device according to the third embodiment, wherein the power-source related connection electrodes 4b and 4c are formed in a ring-like pattern in the same manner as in the case of the second embodiment, there will be no need for altering the electrode patterns on the resin substrate 1 even when surface mounting the semiconductor chip 8 provided with the power-source electrodes arranged in a different configuration, and connection can be made at optional sites on the power-source related connection electrodes 4b and 4c via the connecting wires 17, thereby enhancing general versatility of the semiconductor device.

The semiconductor chip 8 and the connecting wires 17 are sealed by means of the transfer molding process using the thermosetting sealing resin 18 with the aim of shielding from light and protecting the semiconductor chip 8. As a material for the sealing resin 18, a thermosetting resin compound containing fine powders of glass, silica, and the like is used. For the thermosetting resin compound, epoxy resin and silicone resin (preferably, epoxy resin) can be used.

Similar to the cases of the first and second embodiments described hereinbefore, with the semiconductor device according to this embodiment as well, adhesion is enhanced by fixedly attaching the semiconductor chip 8 directly to the resin substrate 1 with the use of the electrically conductive adhesive 16 composed of the resin compound. Consequently, even if a shearing force is caused to occur between the semiconductor chip 8 and the resin substrate 1 due to heating of the semiconductor device, exfoliation therebetween can be inhibited.

Figure 10:
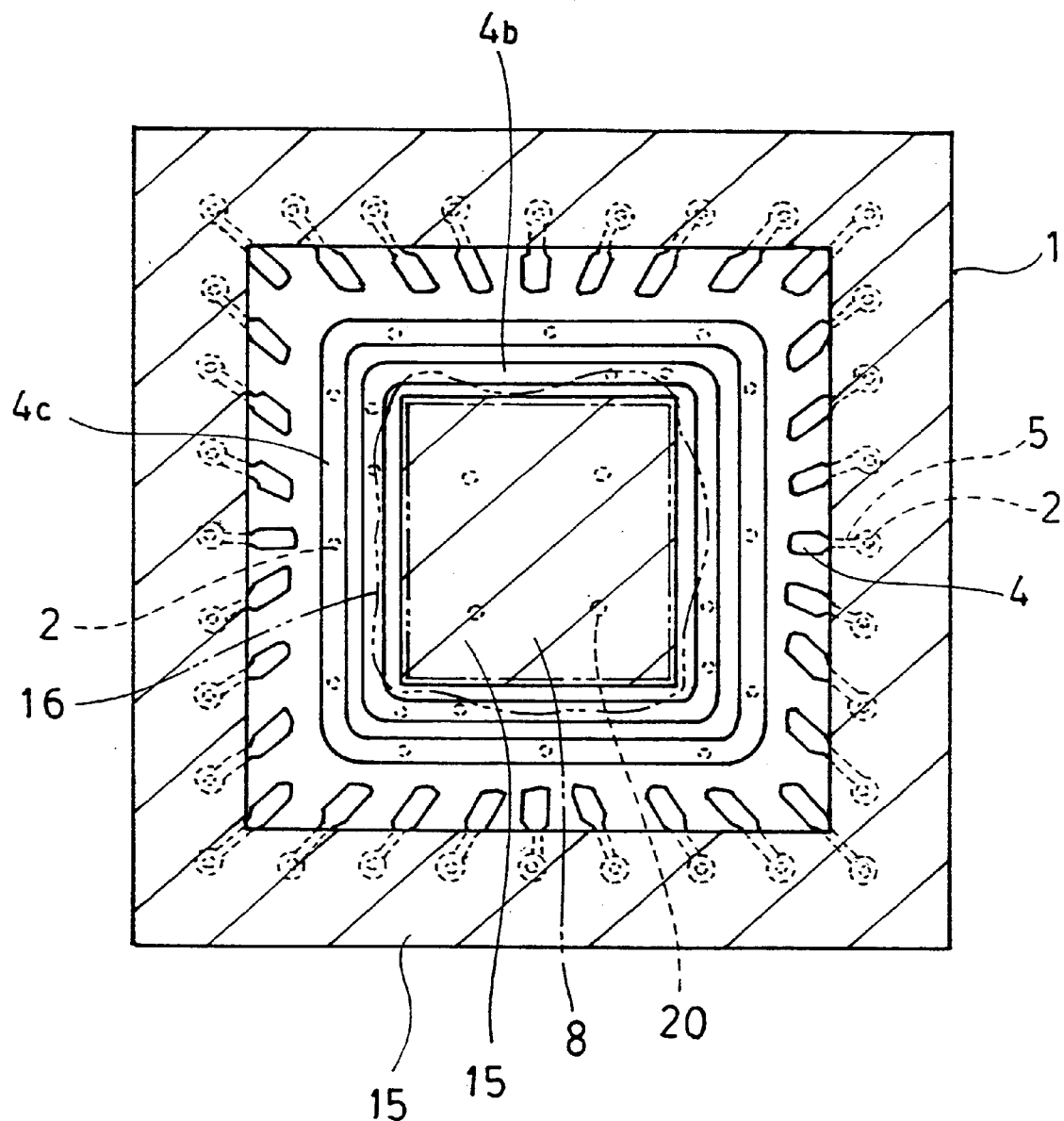
FIG. 10 a plan view showing the front surface of a resin substrate, a component of the semiconductor device according to a modification of the third embodiment of the invention.

FIG. 10 is a plan view showing the front surface of a resin substrate, a component of a semiconductor device according to a modification of the third embodiment described above.

In the modification of the third embodiment shown in the same figure, the insulating resin film 15 composed of a resin material such as epoxy resin, or the like, is formed in a region (as indicated by the imaginary line in FIG. 10) defined in the center area of the front surface of the resin substrate 1 as well, where the semiconductor chip 8 is fixedly attached.

In the case where the semiconductor chip 8 is fixedly attached directly to the resin substrate 1 as in the case of the third embodiment described above, air bubbles are prone to be generated between the resin substrate 1 and the electrically conductive adhesive 16 (or the electrically non-conductive adhesive) due to the presence of minute irregularities on the front surface of the resin substrate 1.

On the other hand, with the structure according to the modification of the third embodiment, since the insulating resin film 15 is formed in the region where the semiconductor chip 8 is to be fixedly attached, the electrically conductive adhesive 16 (or an adhesive electrically non-conductive) will be bonded with the insulating resin film 15. Both the electrically conductive adhesive 16 (or the electrically non-conductive adhesive) and the insulating resin film 15 are composed of resin compounds as respective main constituents, and strong bonding strength can be attained therebetween. In addition, since the front surface of the insulating resin film 15 is highly smooth, there will be only a small chance of air bubbles being formed at the interface between the insulating resin film 15 and the electrically conductive adhesive 16 (or the electrically non-conductive adhesive).

As a result, with the semiconductor device according to the modification, occurrence of exfoliation due to the ingress of water into the air bubbles is inhibited while stronger bonding can be obtained as compared with the case of the third embodiment, thereby further enhancing reliability.

What is claimed is:

1. A semiconductor device comprising:

a resin substrate;

a semiconductor chip fixedly attached to a front surface of the resin substrate; and plural connection electrodes formed on the front surface of the resin substrate and electrically connected with each electrode of the semiconductor chip by connecting wires, said semiconductor chip being fixedly attached to the front surface of the resin substrate with an adhesive composed of a resin material as the main component thereof and without a die pattern, interposed therebetween, wherein at least corner parts of said semiconductor chip are directly attached to a surface of a resin substrate with an adhesive without a die pattern interposed therebetween.

2. A semiconductor device according to claim 1, wherein an electrically conductive adhesive is used as said adhesive while a part of power-source related connection electrodes among the plural connection electrodes are extended to a region where the semiconductor chip is fixedly attached onto the front surface of the resin substrate.

3. A semiconductor device according to claim 2, wherein an insulating resin film is formed in the region where said semiconductor chip being fixedly attached onto the front surface of the resin substrate, excluding areas where said a part of power source related connection electrodes are extended.

4. A semiconductor device according to claim 2, wherein said power-source related connection electrodes among the plural connection electrodes are formed in a ring-like pattern around the periphery of the region where the semiconductor chip is fixedly attached onto the front surface of the resin substrate.

5. A semiconductor device according to claim 4, wherein an insulating resin film is formed in the region where said semiconductor chip being fixedly attached onto the front surface of the resin substrate, excluding areas where said a part of power-source related connection electrodes are extended.

6. A semiconductor device according to claim 1, wherein power source related connection electrodes among the plural connection electrodes are formed in a ring-like pattern around the periphery of the region where the semiconductor chip is fixedly attached onto the front surface of the resin substrate; and an electrically conductive adhesive is used as said adhesive while a region where the electrically conductive adhesive is applied is extended to boundaries adjoining to said power-source related connection electrodes.

7. A semiconductor device according to claim 1, wherein through holes for heat radiation are defined in the region of the resin substrate where the semiconductor chip is fixedly attached, and a terminal for heat radiation is provided at the openings of the respective through holes, facing the back surface of the resin substrate.

8. A semiconductor device according to claim 2, wherein through holes for heat radiation are defined in the region of the resin substrate where the semiconductor chip is fixedly attached, and a terminal for heat radiation is provided at the openings of the respective through holes, facing the back surface of the resin substrate.

9. A semiconductor device according to claim 3, wherein through holes for heat radiation are defined in the region of the resin substrate where the semiconductor chip is fixedly attached, and a terminal for heat radiation is provided at the openings of the respective through holes, facing the back surface of the resin substrate.

10. A semiconductor device according to claim 4, wherein through holes for heat radiation are defined in the region of the resin substrate where the semiconductor chip is fixedly attached, and a terminal for heat radiation is provided at the openings of the respective through holes, facing the back surface of the resin substrate.

11. A semiconductor device according to claim 5, wherein through holes for heat radiation are defined in the region of the resin substrate where the semiconductor chip is fixedly attached, and a terminal for heat radiation is provided at the openings of the respective through holes, facing the back surface of the resin substrate.

12. A semiconductor device according to claim 6, wherein through holes for heat radiation are defined in the region of the resin substrate where the semiconductor chip is fixedly attached, and a terminal for heat radiation is provided at the openings of the respective through holes, facing the back surface of the resin substrate.

\* \* \* \* \*